(12) United States Patent
Li et al.

(10) Patent No.: US 11,094,789 B2
(45) Date of Patent: Aug. 17, 2021

(54) THIN FILM TRANSISTOR AND METHOD FOR MANUFACTURING THE SAME, ARRAY SUBSTRATE, AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Xiaolong Li, Beijing (CN); Jinchao Bai, Beijing (CN); Huibin Guo, Beijing (CN); Xiao Han, Beijing (CN); Yongzhi Song, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/497,658

(22) PCT Filed: Apr. 12, 2019

(86) PCT No.: PCT/CN2019/082445
§ 371 (c)(1),
(2) Date: Sep. 25, 2019

(87) PCT Pub. No.: WO2019/218822
PCT Pub. Date: Nov. 21, 2019

(65) Prior Publication Data
US 2020/0381523 A1 Dec. 3, 2020

(30) Foreign Application Priority Data

May 18, 2018 (CN) .......................... 201810480065.9

(51) Int. Cl.
*H01L 29/417* (2006.01)
*H01L 27/32* (2006.01)
(Continued)

(52) U.S. Cl.
CPC .... *H01L 29/41733* (2013.01); *H01L 27/3248* (2013.01); *H01L 29/401* (2013.01);
(Continued)

(58) Field of Classification Search
CPC .......................... H01L 29/45; H01L 29/41733
See application file for complete search history.

(56) References Cited

U.S. PATENT DOCUMENTS 7,817,218 B2 10/2010 Chae
7,935,579 B2 5/2011 Park et al.
(Continued)

FOREIGN PATENT DOCUMENTS

CN 1858639 A 11/2006
CN 101995711 A 3/2011
(Continued)

OTHER PUBLICATIONS

First Office Action, including Search Report, for Chinese Patent Application No. 201810480065.9, dated Mar. 18, 2020, 12 pages.

*Primary Examiner* — Farun Lu
(74) *Attorney, Agent, or Firm* — Westman, Champlin & Koehler, P.A.

(57) ABSTRACT

Embodiments of the present disclosure disclose a thin film transistor, a method for manufacturing a thin film transistor, an array substrate, and a display device. The thin film transistor includes a source electrode and a drain electrode, each of the source electrode and the drain electrode including a metal substrate and a conductive layer covering the metal substrate. An adhesion between the conductive layer and a photoresist material is larger than an adhesion between the metal substrate and the photoresist material. The metal substrate and the conductive layer are both formed on a base substrate, an orthographic projection of the conductive layer on the base substrate covers an orthographic projection of the metal substrate on the base substrate, and. an area of the orthographic projection of the conductive layer on the base substrate is larger than an area of the orthographic projection of the metal substrate on the base substrate.

3 Claims, 6 Drawing Sheets

(51) Int. Cl.

| | |
|---|---|
| *H01L 29/40* | (2006.01) |
| *H01L 29/66* | (2006.01) |
| *H01L 29/786* | (2006.01) |
| *H01L 21/3213* | (2006.01) |
| *H01L 27/12* | (2006.01) |
| *H01L 29/45* | (2006.01) |

(52) U.S. Cl.
CPC .. *H01L 29/66742* (2013.01); *H01L 29/78618* (2013.01); *H01L 21/32139* (2013.01); *H01L 27/1214* (2013.01); *H01L 29/45* (2013.01)

(56) References Cited

U.S. PATENT DOCUMENTS

| | | |
|---|---|---|
| 8,199,271 B2 | 6/2012 | Chae |
| 9,954,070 B2 | 4/2018 | Wang et al. |
| 2002/0109796 A1 | 8/2002 | Lin et al. |
| 2006/0250535 A1 | 11/2006 | Chae |
| 2007/0013077 A1* | 1/2007 | Lee .................. H01L 27/124 257/762 |
| 2010/0327272 A1 | 12/2010 | Chae |
| 2016/0293633 A1* | 10/2016 | Yang ................. H01L 29/7869 |
| 2017/0033192 A1 | 2/2017 | Wang et al. |

FOREIGN PATENT DOCUMENTS

| | | |
|---|---|---|
| CN | 103700665 A | 4/2014 |
| CN | 104716198 A | 6/2015 |
| CN | 108682692 A | 10/2018 |

* cited by examiner

THIN FILM TRANSISTOR AND METHOD FOR MANUFACTURING THE SAME, ARRAY SUBSTRATE, AND DISPLAY DEVICE

CROSS-REFERENCE TO RELATED APPLICATION

This application is a Section 371 National Stage Application of International Application No. PCT/CN2019/082445, filed on Apr. 12, 2019, entitled "THIN FILM TRANSISTOR AND METHOD FOR MANUFACTURING THE SAME, ARRAY SUBSTRATE, AND DISPLAY DEVICE", which claims the benefit of Chinese Patent Application No. 201810480065.9 filed on May 18, 2018 in the National Intellectual Property Administration of China, the whole disclosure of which is incorporated herein by reference.

TECHNICAL FIELD

The present disclosure relates to the field of display technologies, and in particular, to a thin film transistor and a method for manufacturing a thin film transistor, an array substrate, and a display device.

BACKGROUND

In recent years, a display panel (i.e., a TFT display panel), in which a thin film transistor (abbreviated as TFT) is used as a switch for driving a pixel unit, is widely used in display devices such as mobile phone, computer and the like. Moreover, in order to provide users with high-quality visual enjoyment, the TFT display panel is increasingly pursuing high resolution and high aperture ratio, so that a TFT with a narrow channel has become one of mainstream trends of the TFT.

However, since a channel length of the TFT is generally related to a source electrode and a drain electrode of the TFT, that is, the channel length of the TFT is generally expressed as a distance between the source electrode and the drain electrode of the TFT. Further, the source electrode and drain electrode of the TFT are usually formed by patterning a metal layer covering a surface of an active layer of the TFT through a mask process, so that a manufacturing precision of the channel of the TFT is related to a manufacturing precision of the source electrode and the drain electrode of the TFT.

SUMMARY

In one aspect, a thin film transistor including a source electrode and a drain electrode, each of the source electrode and the drain electrode including a metal substrate and a conductive layer covering the metal substrate, wherein an adhesion between the conductive layer and a photoresist material is larger than an adhesion between the metal substrate and the photoresist material, and the metal substrate and the conductive layer are both formed on a base substrate, an orthographic projection of the conductive layer on the base substrate covers an orthographic projection of the metal substrate on the base substrate, and an area of the orthographic projection of the conductive layer on the base substrate is larger than an area of the orthographic projection of the metal substrate on the base substrate.

Optionally, the metal substrate includes a copper substrate, an aluminum substrate, or a copper-aluminum laminated substrate.

Optionally, the conductive layer includes an indium tin oxide layer.

Optionally, the thin film transistor further includes an active layer on the base substrate, the metal substrate is formed on a side of the active layer distal to the base substrate, and the conductive layer is formed on a surface of the metal substrate distal to the active layer.

Optionally, a surface of the conductive layer facing the metal substrate is in direct contact with a surface of the metal substrate facing the conductive layer.

Optionally, a thickness of the conductive layer is smaller than a thickness of the metal substrate.

Optionally, the thin film transistor further includes an ohmic contact layer on a surface of the active layer distal to the base substrate, and the ohmic contact layer is located between the active layer and the metal substrate.

Optionally, the active layer includes a source region, a channel region and a drain region, the source region contacts the source electrode, the drain region contacts the drain electrode, and the channel region is located between the source region and the drain region; and the conductive layer of the source electrode includes a first side face facing the channel region, and the metal substrate of the source electrode includes a first side face facing the channel region, and the first side face of the conductive layer of the source electrode is more protrudent towards the channel region than the first side face of the metal substrate of the source electrode.

Optionally, the conductive layer of the drain electrode includes a second side face facing the channel region, and the metal substrate of the drain electrode includes a second side face facing the channel region, and the second side face of the conductive layer of the drain electrode is more protrudent towards the channel region than the second side face of the metal substrate of the drain electrode.

In another aspect, a method for manufacturing a thin film transistor is provided, including:

forming an active material layer of the thin film transistor on a base substrate;

sequentially depositing a metal-substrate material layer and a conductive material layer on a surface of the active material layer distal to the base substrate; and sequentially performing a photolithography process on the conductive material layer and the metal-substrate material layer to form a conductive layer and a metal substrate, so that each of a source electrode and a drain electrode of the thin film transistor includes the metal substrate and the conductive layer, wherein an adhesion between the conductive material layer and a photoresist material used in the photolithography process is larger than an adhesion between the metal-substrate material layer and the photoresist material, and an orthographic projection of the conductive layer on the base substrate covers an orthographic projection of the metal substrate on the base substrate, and an area of the orthographic projection of the conductive layer on the base substrate is larger than an area of the orthographic projection of the metal substrate on the base substrate.

Optionally, the step of sequentially depositing the metal-substrate material layer and the conductive material layer on the surface of the active material layer distal to the base substrate includes:

depositing at least one of a copper material and an aluminum material on the surface of the active material layer distal to the base substrate to form the metal-substrate material layer; and depositing an indium tin oxide material on a surface of the metal-substrate material layer distal to the active material layer to form the conductive material layer.

Optionally, the step of sequentially performing the photolithography process on the conductive material layer and the metal-substrate material layer includes:

coating a surface of the conductive material layer distal to the metal-substrate material layer with the photoresist material;

exposing and developing the photoresist material by using a mask;

etching the conductive material layer to form the conductive layer; and etching the metal-substrate material layer to form the metal substrate.

Optionally, the step of sequentially performing the photolithography process on the conductive material layer and the metal-substrate material layer includes:

coating a surface of the conductive material layer distal to the metal-substrate material layer with the photoresist material;

exposing and developing the photoresist material by using a gray-tone mask to form a first photoresist layer and a second photoresist layer, the first photoresist layer having a thickness larger than the second photoresist;

etching a part of the conductive material layer, which is not covered by either the first photoresist layer or the second photoresist layer;

etching a part of the metal-substrate material layer, which is not covered by either the first photoresist layer or the second photoresist layer;

ashing the second photoresist layer;

etching a part of the conductive material layer, which is not covered by the first photoresist layer, to form the conductive layer; and etching a part of the metal-substrate material layer, which is not covered by the first photoresist layer, to form the metal substrate.

Optionally, the method for manufacturing the thin film transistor further includes: depositing an ohmic contact material layer on the surface of the active material layer distal to the base substrate, wherein, in the step of etching a part of the metal-substrate material layer which is not covered by either the first photoresist layer or the second photoresist layer, a part of each of the ohmic contact material layer and the active material layer, which is not covered by either the first photoresist layer or the second photoresist layer, is also etched; and wherein, in the step of etching a part of the metal-substrate material layer which is not covered by the first photoresist layer, a part of the ohmic contact material layer, which is not covered by the first photoresist layer, is also etched.

In a further aspect, an array substrate is provided, including: a base substrate; and a plurality of thin film transistors arranged in an array on the base substrate, wherein at least one of the plurality of thin film transistors is the thin film transistor as described above or the thin film transistor manufactured by the method as described above.

Optionally, the array substrate further includes a pixel electrode on a side of the thin film transistor distal to the base substrate, and the pixel electrode is electrically connected to the conductive layer of one of the source electrode and the drain electrode of the thin film transistor.

Optionally, the array substrate further includes: a passivation layer between the conductive layer of the thin film transistor and the pixel electrode; and a conductive member in the passivation layer, wherein the pixel electrode is electrically connected to the conductive layer of one of the source electrode and the drain electrode of the thin film transistor through the conductive member.

Optionally, the pixel electrode, the conductive member, and the conductive layer include the same conductive material.

In another further aspect, a display device including the array substrate as described above.

Figure 1:
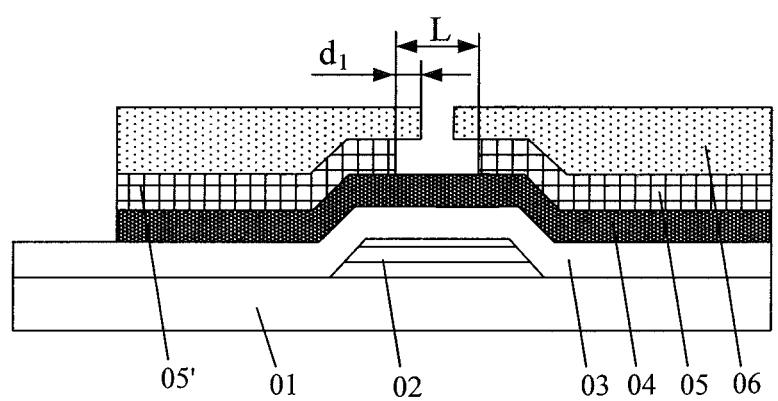
FIG. 1 is a schematic structural view of a thin film transistor in the related art.

For the sake of clarity, dimensions of various structures in the drawings of the embodiments of the present disclosure are exaggerated, and they are not intended to represent actual dimensions and scales, unless specifically stated otherwise.

DETAILED DESCRIPTION OF EMBODIMENTS

In order to make objectives, technical solutions and advantages of embodiments of the present disclosure more clear, the technical solutions of the embodiments of the present disclosure will be clearly and completely described below in conjunction with the drawings of the embodiments of the present disclosure. It is apparent that the described embodiments are only a part of the embodiments of the present disclosure, rather than all of the embodiments. All other embodiments, which are obtained by those skilled in the art based on the described embodiments of the present disclosure without any creative work, shall fall within the scope of the disclosure.

As used herein, an expression "adhesion" is intended to express an adhesive property between two material layers, for example, it may be expressed by an adhesive force between two material layers.

As used herein, unless otherwise stated, a photoresist may include various types of photoresists which are used in manufacturing processes of a thin film transistor and an array substrate, for example, it may include a positive photoresist or a negative photoresist.

Referring to FIG. 1, a thin film transistor generally includes a base substrate 01, a gate electrode 02, a gate insulating layer 03, an active layer 04, a source electrode 05, and a drain electrode 05'. The gate electrode 02, the gate insulating layer 03, the active layer 04, the source electrode 05, and the drain electrode 05' are sequentially disposed on a surface of the base substrate 01. The source electrode 05 and the drain electrode 05' are generally formed by patterning and etching a metal layer deposited on a surface of the active layer 04 distal to the gate insulating layer 03 through a mask process. Currently, in a process of patterning and etching the metal layer deposited on the surface of the active layer 04 distal to the gate insulating layer 03 through the mask process, as an adhesion between the metal layer and the photoresist 06 is relatively low, it is difficult to form a close adhesion between the metal layer and the photoresist 06. As a result, an etching liquid may easily damage an etched edge of the metal layer, that is, excessive etching may be presented at the edge of the metal layer, resulting in a large deviation of critical dimensions (abbreviated as CD) of both the source electrode 05 and the drain electrode 05' which is formed by etching the metal layer. For example, a CD deviation d1 of the source electrode 05 or the drain electrode 05' shown in FIG. 1 on one side may be 0.6 µm. A channel length of the thin film transistor depends on a distance between the source electrode and the drain electrode, which is indicated by a distance L as shown in FIG. 1, thus the channel length of the formed thin film transistor may be larger than an expected length by 1.2 µm. As a result, it is difficult to manufacture a thin film transistor with a narrow channel that meets requirements.

Figure 2:
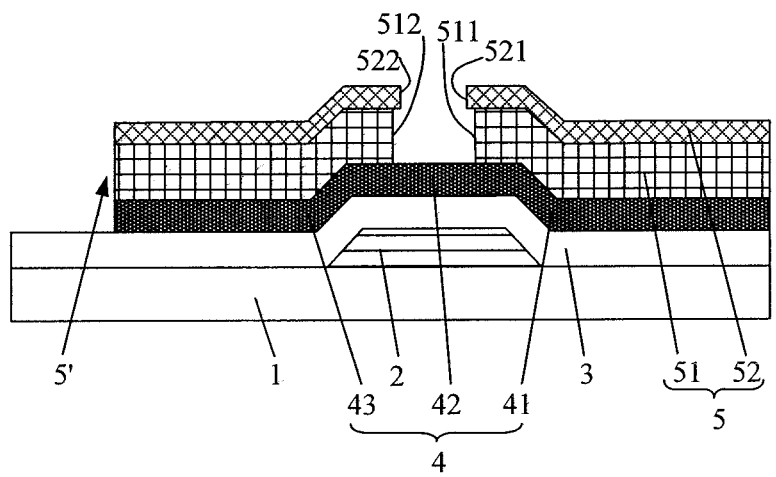
FIG. 2 is a schematic structural view of a thin film transistor according to some embodiments of the present disclosure.

Some embodiments of the present disclosure provide a thin film transistor. Referring to FIG. 2, the thin film transistor is formed on a base substrate 1 and includes: a gate electrode 2 disposed on the base substrate 1; a gate insulating layer 3 covering the gate electrode 2; an active layer 4 disposed on a surface of the gate insulating layer 3 distal to the base substrate; a source electrode 5 and a drain electrode 5' which are both disposed on a surface of the active layer 4 distal to the base substrate. The thin film transistor includes the source electrode 5 and the drain electrode 5'. Each of the source electrode 5 and the drain electrode 5' includes a metal substrate 51 and a conductive layer 52 covering the metal substrate 51. An adhesion between the conductive layer 52 and a photoresist material is larger than an adhesion between the metal substrate 51 and the photoresist material, that is, with respect to the same photoresist material, the conductive layer 52 may adhere to a photoresist material layer more closely than the metal substrate 51.

As shown in FIG. 2, the metal substrate 51 is formed on a surface of the active layer 4 of the thin film transistor, and the conductive layer 52 is formed on a surface of the metal substrate 51 distal to the active layer 4. In a specific manufacturing process, a metal-substrate material layer and a conductive material layer are sequentially deposited on the surface of the active layer 4 distal to the base substrate 1, then the conductive material layer and the metal-substrate material layer are sequentially patterned through a photolithography process, so that the conductive material layer and the metal-substrate material layer, which have been both patterned, form the source electrode 5 and the drain electrode 5' of the thin film transistor.

In the thin film transistor according to the embodiments of the present disclosure, an orthographic projection of the conductive layer 52 on the base substrate 1 covers an orthographic projection of the metal substrate 51 on the base substrate 1. Further, an area of the orthographic projection of the conductive layer 52 on the base substrate 1 is larger than an area of the orthographic projection of the metal substrate 51 on the base substrate 1. More specifically, as shown in FIG. 2, the active layer 4 includes a source region 41, a channel region 42 and a drain region 43. The source region 41 contacts the source electrode 5, for example, the source region 41 contacts the metal substrate 51 of the source electrode 5. The drain region 43 contacts the drain electrode 5', for example, the drain region 43 contacts the metal substrate 51 of the drain electrode 5'. The channel region 42 is located between the source region 41 and the drain region 43. The conductive layer 52 of the source electrode 5 includes a first side face 521 facing the channel region 42, and the metal substrate 51 of the source electrode 5 includes a first side face 511 facing the channel region 42, and the first side face 521 of the conductive layer 52 of the source electrode 5 is more protrudent towards the channel region 42 than the first side face 511 of the metal substrate 51 of the source electrode 5. The conductive layer 52 of the drain electrode 5' includes a second side face 522 facing the channel region 42, and the metal substrate 51 of the drain electrode 5' includes a second side face 512 facing the channel region 42, and the second side face 522 of the conductive layer 52 of the drain electrode 5' is more protrudent towards the channel region 42 than the second side face 512 of the metal substrate 51 of the drain electrode 5'.

Further, a surface (that is, a lower surface of the conductive layer 52 as shown in FIG. 2) of the conductive layer 52 facing the metal substrate 51 is in direct contact with a surface (that is, an upper surface of the metal substrate 51 as shown in FIG. 2) of the metal substrate 51 facing the conductive layer 52. The metal substrate 51 is covered with the conductive layer 52, and each of the source electrode 5 and the drain electrode 5' is formed of the metal substrate 51 together with the conductive layer 52. Thus, in a process of forming the source electrode 5 and the drain electrode 5' through the photolithography process, the conductive material layer and the metal-substrate material layer are sequentially patterned. In the photolithography process, the adhesion between the conductive material layer and the photoresist material is larger than the adhesion between the metal-substrate material layer and the photoresist material, so that the conductive material layer is closely adhered to the photoresist material, thereby effectively reducing a CD deviation of each of the conductive layer and the metal substrate in the photolithography process. In this way, a manufacturing precision of both the source electrode and drain electrode is improved, that is, a manufacturing precision of the channel of the thin film transistor is improved, thereby facilitating narrowing the channel length of the thin film transistor.

It should be noted that the above metal substrate 51 may be generally provided as a copper substrate, an aluminum substrate or a copper-aluminum laminated substrate. Of course, the embodiments of the present disclosure are not limited thereto, and other similar conductive metal substrates are applicable. The conductive layer 52 may be generally provided as an indium tin oxide (i.e., ITO) layer, or a light transmissive conductive layer formed of a material similar in performance to ITO.

Figure 3:
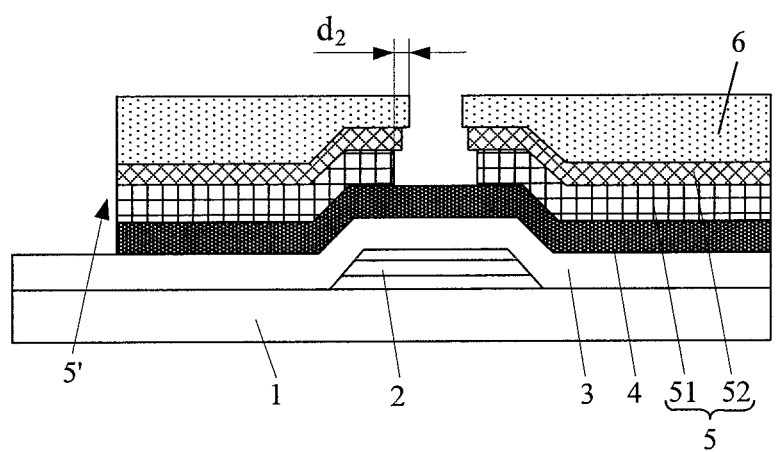
FIG. 3 is a schematic structural view of the thin film transistor shown in FIG. 2, which is covered with a photoresist material.
Figure 4:
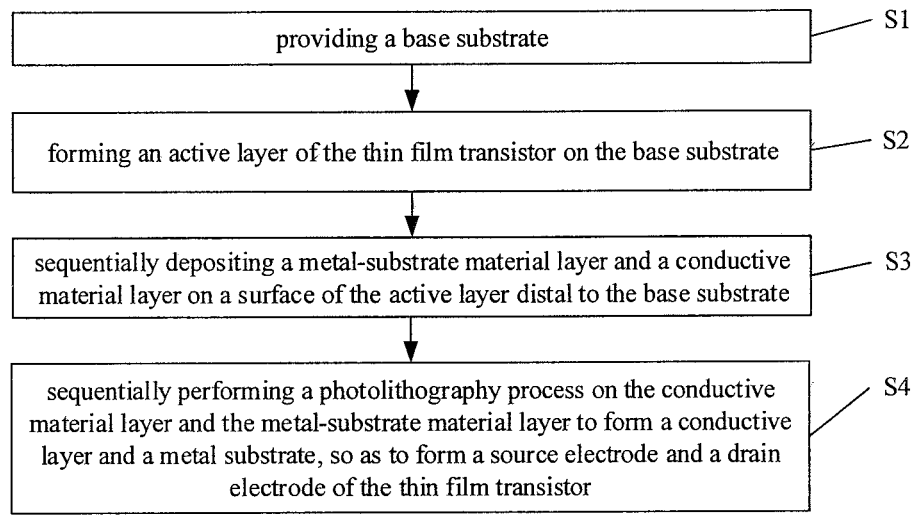
FIG. 4 is a flowchart of a method for manufacturing a thin film transistor according to some embodiments of the present disclosure.

Correspondingly, the embodiments of the present disclosure further provide a method for manufacturing a thin film transistor, which is used to manufacture the thin film transistor provided by the above embodiments. Referring to FIG. 3 and FIG. 4, the method for manufacturing the thin film transistor may include:

step S1, providing a base substrate 1;
step S2, forming an active layer 4 of the thin film transistor on the base substrate 1;

step S3, sequentially depositing a metal-substrate material layer and a conductive material layer on a surface of the active layer 4 distal to the base substrate 1; and step S4, sequentially performing a photolithography process on the conductive material layer and the metal-substrate material layer to form a conductive layer 52 and a metal substrate 51, so as to form a source electrode and a drain electrode of the thin film transistor.

An adhesion between the conductive material layer and a photoresist material used in the photolithography process is larger than an adhesion between the metal-substrate material layer and the photoresist material.

Figure 5:
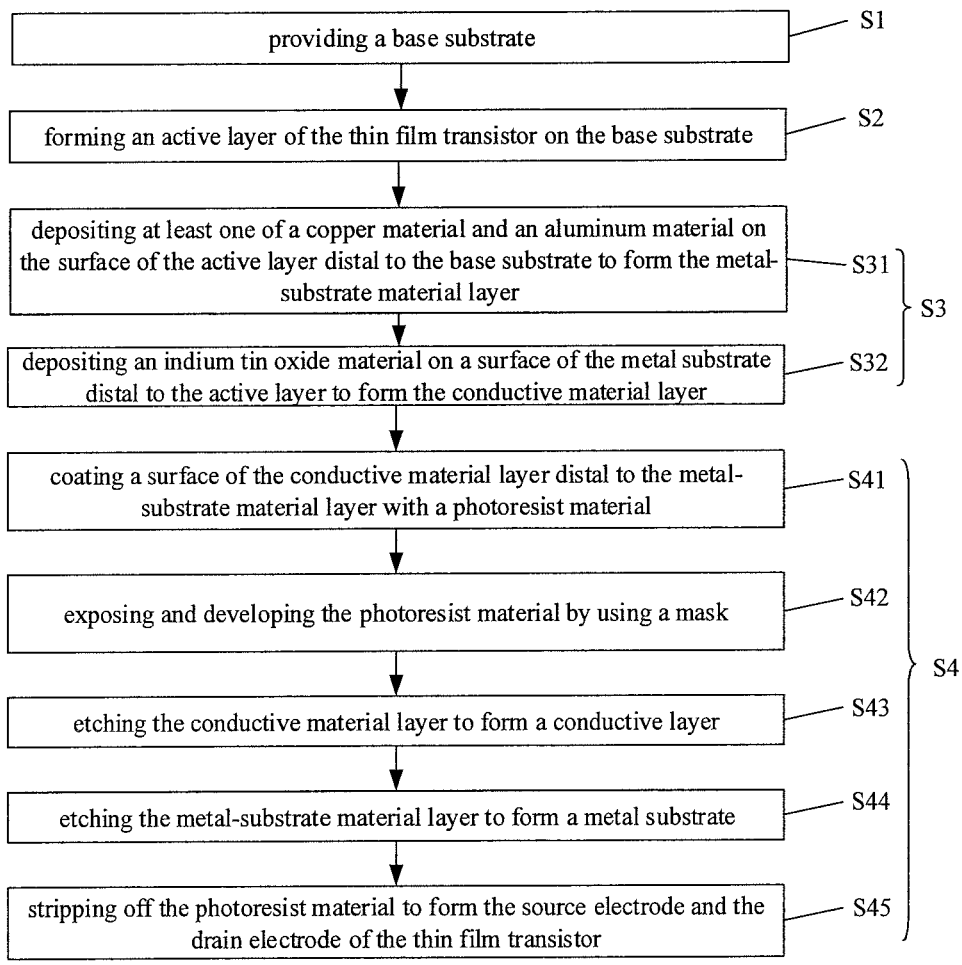
FIG. 5 is a detailed flowchart of a method for manufacturing a thin film transistor according to some embodiments of the present disclosure.

Further, referring to FIG. 5, in the above step S4, the step of sequentially performing the photolithography process on the conductive material layer and the metal-substrate material layer includes:

step S41, coating a surface of the conductive material layer distal to the metal-substrate material layer with a photoresist material 6;

step S42, exposing and developing the photoresist material 6 by using a mask;

step S43, etching the conductive material layer to form a conductive layer 52; and step S44, etching the metal-substrate material layer to form a metal substrate 51.

The inventors have found that, through several experiments, in the process of sequentially performing the photolithography process on the conductive material layer and the metal-substrate material layer to form the source electrode and drain electrode, the adhesion between the conductive material layer and the photoresist material used in the photolithography process is larger than the adhesion between the metal-substrate material layer and the photoresist material, so that the conductive material layer is closely adhered to the photoresist material, thereby effectively reducing an excessive etching of an edge of the conductive material layer caused by an etching liquid. Moreover, the conductive material layer may protect the metal-substrate material layer, so as to further reduce an excessive etching of an edge of the metal substrate caused by the etching liquid. As a result, both the source electrode 5 and the drain electrode 5', which are formed through the photolithography process, have a relatively small CD deviation. Referring to FIG. 1 and FIG. 3, for a thin film transistor having the same expected channel length, the metal layer is directly etched to form the source electrode 05 and the drain electrode 05' in FIG. 1, so that the CD deviation d1 on one side may be 0.6 μm, thus the channel length of the formed thin film transistor is 1.2 μm larger than the expected channel length; the conductive material layer and the metal-substrate material layer are sequentially etched to form the source electrode 5 and the drain electrode 5' in FIG. 3, so that the CD deviation d2 of the source electrode 5 and the drain electrode 5' on one side may be effectively reduced to 0.3 μm, thus the channel length of the formed thin film transistor is 0.6 μm larger than the expected channel length. That is to say, the channel length of the thin film transistor according to the embodiments of the present disclosure may be effectively reduced by 0.6 μm, compared with the current thin film transistor. Thus, the channel length of the thin film transistor may be reduced.

In addition, in the above step S4, the step of sequentially performing the photolithography process on the conductive material layer and the metal-substrate material layer may further include:

step S45, stripping off the photoresist material 6 to form the source electrode and the drain electrode of the thin film transistor.

For example, the photoresist material 6 is usually stripped off through a dry method. When the metal substrate 51 is a copper substrate, in the thin film transistor provided by the embodiments of the present disclosure, the conductive layer 52 is used to cover a surface of the copper substrate so as to effectively protect the copper substrate from oxidation, which is otherwise caused by dry-stripping off the photoresist material 6. In this way, a conductivity of the copper substrate is kept good and stable, that is, a conductivity of the metal substrate 51 of each of the source electrode 5 and the drain electrode 5' is kept good and stable.

Further, referring to FIG. 5, in the above step S3, the step of sequentially depositing the metal-substrate material layer and the conductive material layer on the surface of the active layer distal to the base substrate includes:

step S31, depositing at least one of a copper material and an aluminum material on the surface of the active layer distal to the base substrate to form the metal-substrate material layer; and step S32, depositing an indium tin oxide material on a surface of the metal-substrate material layer distal to the active layer to form the conductive material layer.

Since the adhesion between the indium tin oxide material and the photoresist material used in the photolithography process is larger than the adhesion between the copper material or the aluminum material and the photoresist material, a close adhesion may be formed between the conductive material layer formed of the indium tin oxide material and the photoresist material layer in the photolithography process, so that the excessive etching of an edge of each of the conductive material layer and the metal-substrate material layer caused by the etching liquid may be avoided. Of course, the embodiments of the present disclosure are not limited thereto, and other similar conductive metal materials may be used to form the metal-substrate material layer, and the conductive material layer may also be formed by using a material similar to ITO, as long as the adhesion between the conductive material layer and the photoresist materials used in the photolithography process is larger than the adhesion between the metal-substrate material layer and the photoresist material.

Optionally, in order to ensure a good signal transmission performance of the source electrode 5 and the drain electrode 5', a thickness of the conductive layer 52 is generally smaller than a thickness of the metal substrate 51, that is, both the source electrode 5 and the drain electrode 5' are mainly dependent on the metal substrate 51 to perform signal transmission.

Figure 6:
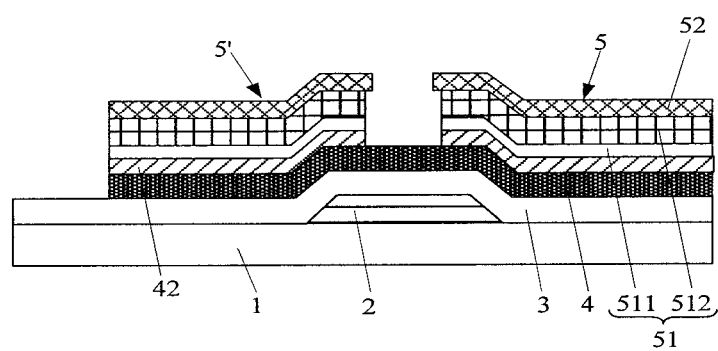
FIG. 6 is a schematic structural view of a thin film transistor according to some embodiments of the present disclosure.

FIG. 6 illustrates a cross-sectional view of a thin film transistor according to some embodiments of the present disclosure. As shown in FIG. 6, the thin film transistor is formed on a base substrate 1, and includes: a gate electrode 2 disposed on the base substrate 1; a gate insulating layer 3 covering the gate electrode 2; an active layer 4 disposed on a surface of the gate insulating layer 3 distal to the base substrate; an ohmic contact layer 42 disposed on a surface of the active layer 4 distal to the base substrate; and a source electrode 5 and a drain electrode 5' which are both disposed on a surface of the ohmic contact layer 42 distal to the base substrate. Each of the source electrode 5 and the drain electrode 5' includes a metal substrate 51 and a conductive layer 52 covering the metal substrate 51. The ohmic contact layer 42 is located between the active layer 4 and the metal substrate 51. An adhesion between the conductive layer 52 and a photoresist material is larger than an adhesion between the metal substrate 51 and the photoresist material.

For example, the metal substrate 51 may have a single layer structure or a multilayer structure. Illustratively, referring to FIG. 6, the metal substrate 51 may include a first metal layer 511 and a second metal layer 512 which are disposed in a stacked manner. For example, the first metal layer 511 may be an aluminum metal layer, and the second metal layer 512 may be a copper metal layer, that is, the metal substrate includes a copper-aluminum laminated substrate. As another example, the conductive layer 52 may include an indium tin oxide layer.

It should be noted that other structures of the thin film transistor in the embodiment as shown in FIG. 6 may refer to those of the thin film transistor in the above embodiments, and details are not described herein again.

Figure 7:
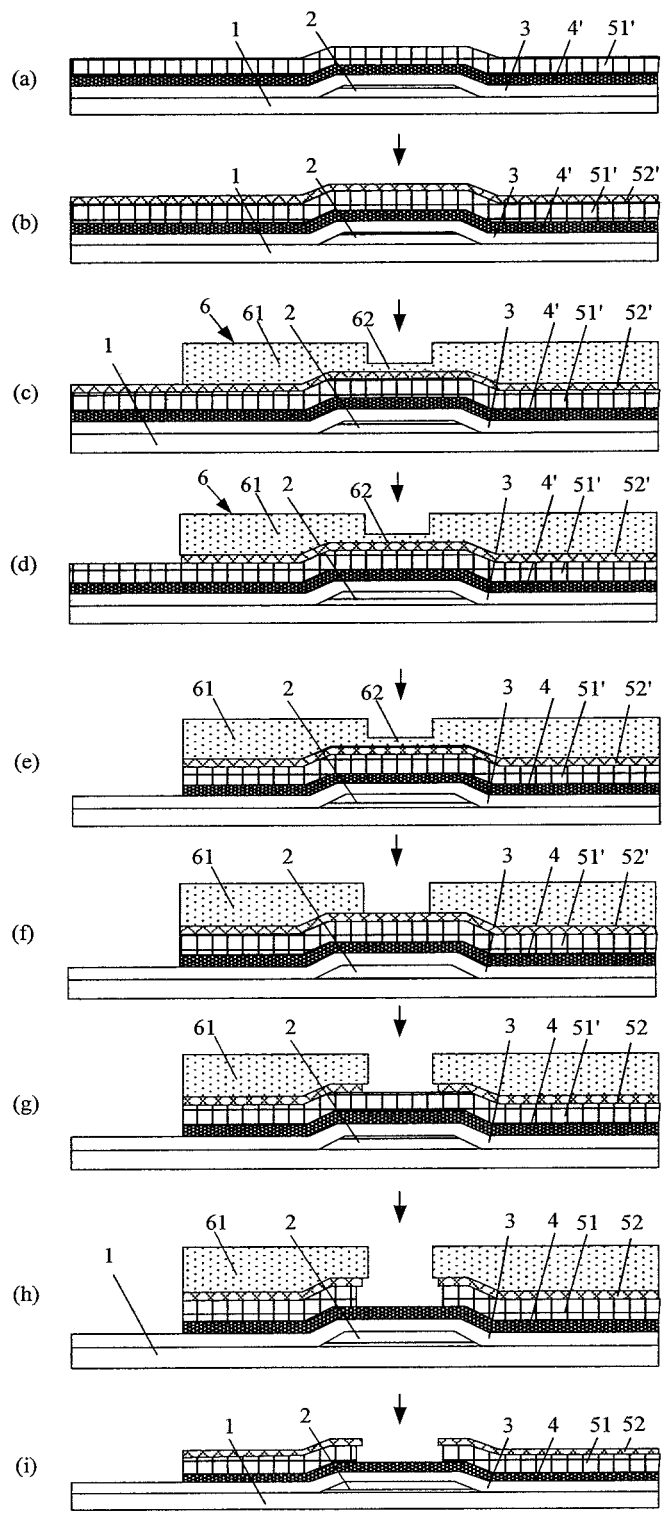
FIG. 7 is a flowchart schematically showing structures formed by performing various steps of a method for manufacturing a thin film transistor according to some embodiments of the present disclosure.

Further, in order to more clearly describe the thin film transistor and the method for manufacturing the thin film transistor according to the embodiments of the present disclosure, referring to FIG. 2 and FIG. 7, when the thin film transistor shown in FIG. 2 is manufactured, the method for manufacturing the thin film transistor is specifically shown in FIG. 7.

In step a, the gate electrode 2, the gate insulating layer 3, and an active material layer 4' are sequentially formed on the base substrate 1, and a metal-substrate material layer 51' is deposited on the surface of the active material layer 4' distal to the base substrate 1. For example, at least one of a copper material and an aluminum material may be deposited on the surface of the active material layer 4' distal to the base substrate 1 to form a metal-substrate material layer 51'.

In step b, a conductive material layer 52' is deposited on a surface of the metal-substrate material layer 51' distal to the active material layer 4'. For example, an ITO material may be deposited on the surface of the metal-substrate material layer 51' distal to the active material layer 4' to form the conductive material layer 52'.

In step c, a surface of the conductive material layer 52' distal to the metal-substrate material layer 51' is coated with a photoresist material 6, and the photoresist material 6 is exposed and developed by using a mask. For example, the photoresist material 6 may be exposed and developed by a gray-tone mask to form a first photoresist layer 61 and a second photoresist layer 62. A thickness of the first photoresist layer 61 is larger than that of the second photoresist layer 62. A position of the first photoresist layer 61 corresponds to a position of the source electrode and drain electrode to be formed, and a position of the second photoresist layer 62 corresponds to a position of the channel to be formed.

In step d, a part of the conductive material layer 52', which is not covered by either the first photoresist layer 61 or the second photoresist layer 62, is etched.

In step e, a part of the metal-substrate material layer 51', which is not covered by either the first photoresist layer 61 or the second photoresist layer 62, is etched.

In step f, the second photoresist layer 62 is ashed.

In step g, a part of the conductive material layer 52', which is not covered by the first photoresist layer 61, is etched to form the conductive layer 52.

In step h, a part of the metal-substrate material layer 51', which is not covered by the first photoresist layer 61, is etched to form the metal substrate 51.

In step i, the first photoresist layer 61 is stripped off from a surface of the conductive layer 52, so that the metal substrate 51 and the conductive layer 52 together form the source electrode and the drain electrode of the thin film transistor.

In the above step e, a part of the active material layer 4', which is not covered by either the first photoresist layer 61 or the second photoresist layer 62, is also etched.

Referring to FIG. 6, when the thin film transistor shown in FIG. 6 is manufactured, the method for manufacturing the thin film transistor may be changed as follows. In the step a, the gate electrode 2, the gate insulating layer 3, the active material layer 4' and an ohmic contact material layer are sequentially formed on the base substrate 1, and a first metal material layer and a second metal material layer are sequentially deposited on a surface of the ohmic contact material layer distal to the base substrate 1. In the step e, a part of both the active material layer 4' and the ohmic contact material layer, which are not covered by either the first photoresist layer 61 or the second photoresist layer 62, are also etched. In the step h, a part of the ohmic contact material layer, which is not covered by the first photoresist layer 61, is also etched. In this way, an ohmic contact layer 42 is formed between the active layer 4 and the metal substrate 51 to improve ohmic contact ability between the active layer and each of the source electrode and drain electrode of the thin film transistor.

Some embodiments of the present disclosure further provide an array substrate, the array substrate including a base substrate, and the thin film transistors according to the above embodiments, which are arranged on a surface of the base substrate in an array. The thin film transistors in the array substrate have the same advantages as the thin film transistors in the above embodiments, which will not be described herein again.

Figure 8:
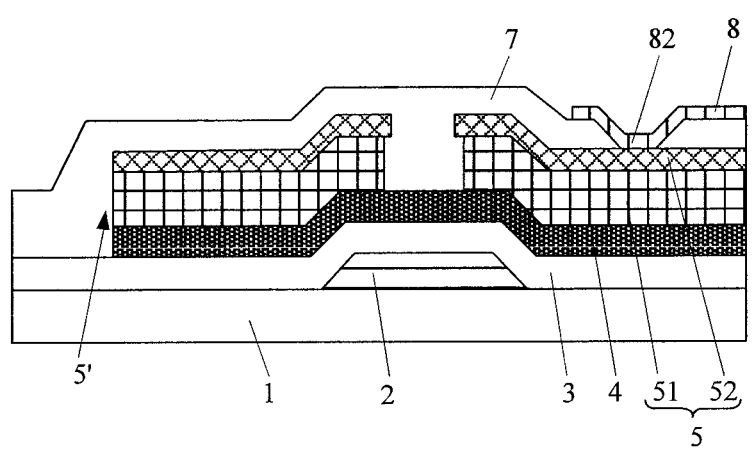
FIG. 8 is a schematic structural view of an array substrate according to some embodiments of the present disclosure.

Optionally, referring to FIG. 8, the array substrate further includes a pixel electrode 8 disposed on a side of the thin film transistor distal to the base substrate 1. The pixel electrode 8 is electrically connected to the conductive layer 52 of one of the source electrode and the drain electrode of a corresponding thin film transistor.

In a specific implementation, a passivation layer 7 is formed on a surface of the source electrode and drain electrode distal to the base substrate 1, and the pixel electrode 8 is formed on a surface of the passivation layer 7 distal to the source electrode and drain electrode. The pixel electrode 8 is usually an ITO electrode, and the conductive layer 52 of one of the source electrode and drain electrode 5 is also formed of an ITO material or a material similar to ITO. A via hole is formed in the passivation layer 7. When the pixel electrode 8 is formed, a conductive member 82 is formed in the via hole. The pixel electrode 8 is electrically connected to the conductive layer 52 through the conductive member 82. Since the pixel electrode 8, the conductive member 82 and the conductive layer 52 are made of the same or similar material, it is easy to make the pixel electrode 8 and the conductive layer 52 have the same or similar electrically conductive property, so that a contact performance between the pixel electrode 8 and the conductive layer 52 may be enhanced, that is, an electrically conductive stability between the pixel electrode 8 and the conductive layer 52 is improved. In this way, an electrically conductive stability between the pixel electrode 8 and the source electrode or the drain electrode of the corresponding thin film transistor may be improved, thereby facilitating improving a display performance of the array substrate.

Embodiments of the present disclosure further provide a display device, which includes the array substrate provided by the above embodiments. The array substrate in the display device has the same advantages as the array substrate in the above embodiments, and details are not described herein again.

The display device provided by the above embodiments may be a product or component having a display function, such as a mobile phone, a tablet computer, a notebook computer, a display, a television, a digital photo frame, or a navigator.

The above descriptions are only specific embodiments of the embodiments of the present disclosure, but the scope of the embodiments of the present disclosure is not limited thereto. All changes or substitutions, which can be easily envisaged by those skilled in the art within the technical scope disclosed in the embodiments of the present disclosure, are intended to be included within the scope of the embodiments of the present disclosure. Therefore, the scope of the embodiments of the present disclosure shall be defined by the scope of the claims.

What is claimed is:

1. A method for manufacturing a thin film transistor, comprising:

forming an active material layer of the thin film transistor on a base substrate;

sequentially depositing a metal-substrate material layer and a conductive material layer on a surface of the active material layer distal to the base substrate; and sequentially performing a photolithography process on the conductive material layer and the metal-substrate material layer to form a conductive layer and a metal substrate, so that each of a source electrode and a drain electrode of the thin film transistor comprises the metal substrate and the conductive layer, wherein an adhesion between the conductive material layer and a photoresist material used in the photolithography process is larger than an adhesion between the metal-substrate material layer and the photoresist material; and an orthographic projection of the conductive layer on the base substrate covers an orthographic projection of the metal substrate on the base substrate, and an area of the orthographic projection of the conductive layer on the base substrate is larger than an area of the orthographic projection of the metal substrate on the base substrate, and wherein the step of sequentially performing the photolithography process on the conductive material layer and the metal-substrate material layer comprises:

coating a surface of the conductive material layer distal to the metal-substrate material layer with the photoresist material;

exposing and developing the photoresist material by using a gray-tone mask to form a first photoresist layer and a second photoresist layer, the first photoresist layer having a thickness larger than the second photoresist;

etching a part of the conductive material layer, which is not covered by either the first photoresist layer or the second photoresist layer;

etching a part of the metal-substrate material layer, which is not covered by either the first photoresist layer or the second photoresist layer;

ashing the second photoresist layer;

etching a part of the conductive material layer, which is not covered by the first photoresist layer, to form the conductive layer; and etching a part of the metal-substrate material layer, which is not covered by the first photoresist layer, to form the metal substrate.

2. The method for manufacturing the thin film transistor of claim 1, wherein the step of sequentially depositing the metal-substrate material layer and the conductive material layer on the surface of the active material layer distal to the base substrate comprises:

depositing at least one of a copper material and an aluminum material on the surface of the active material layer distal to the base substrate to form the metal-substrate material layer; and depositing an indium tin oxide material on a surface of the metal-substrate material layer distal to the active material layer to form the conductive material layer.

3. The method for manufacturing the thin film transistor of claim 1, further comprising: depositing an ohmic contact material layer on the surface of the active material layer distal to the base substrate, wherein, in the step of etching a part of the metal-substrate material layer which is not covered by either the first photoresist layer or the second photoresist layer, a part of each of the ohmic contact material layer and the active material layer, which is not covered by either the first photoresist layer or the second photoresist layer, is also etched; and wherein, in the step of etching a part of the metal-substrate material layer which is not covered by the first photoresist layer, a part of the ohmic contact material layer, which is not covered by the first photoresist layer, is also etched.

* * * * *